(12) United States Patent
Shi et al.

(10) Patent No.: US 9,786,644 B2
(45) Date of Patent: Oct. 10, 2017

(54) METHODS OF FABRICATING A SEMICONDUCTOR PACKAGE

(71) Applicants: Hongbin Shi, Hwaseong-si (KR); Hojeong Moon, Daejeon (KR); Kang Joon Lee, Hwaseong-si (KR)

(72) Inventors: Hongbin Shi, Hwaseong-si (KR); Hojeong Moon, Daejeon (KR); Kang Joon Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/168,240

(22) Filed: May 30, 2016

(65) Prior Publication Data
US 2016/0372433 A1    Dec. 22, 2016

(30) Foreign Application Priority Data

Jun. 17, 2015  (KR) .......................... 10-2015-0086003

(51) Int. Cl.
*H01L 23/00* (2006.01)
*H01L 25/00* (2006.01)
(Continued)

(52) U.S. Cl.
CPC .......... *H01L 25/50* (2013.01); *H01L 23/3128* (2013.01); *H01L 23/49811* (2013.01); *H01L 25/105* (2013.01); *H01L 2224/11849* (2013.01); *H01L 2224/1312* (2013.01); *H01L 2224/1357* (2013.01); *H01L 2224/13109* (2013.01); *H01L 2224/13111* (2013.01); *H01L 2224/13113* (2013.01); *H01L 2224/13116* (2013.01); *H01L 2224/13139* (2013.01); *H01L 2224/16227* (2013.01); *H01L 2224/32225* (2013.01); *H01L 2224/48091* (2013.01); *H01L 2224/48227* (2013.01); *H01L 2224/73265* (2013.01); *H01L 2225/1023* (2013.01); (Continued)

(58) Field of Classification Search
CPC ....................................................... H01L 24/11
See application file for complete search history.

(56) References Cited

U.S. PATENT DOCUMENTS 6,336,262 B1    1/2002   Dalal et al.
6,787,921 B2    9/2004   Huang
(Continued)

OTHER PUBLICATIONS

Dreiza, Moody, et al., "High Density PoP (Package-on-Package) and Package Stacking Development", 2007 Electronic Components and Technology Conference, 2007 IEEE, pp. 1397-1402.
(Continued)

*Primary Examiner* — William Harriston
(74) *Attorney, Agent, or Firm* — Renaissance IP Law Group LLP

(57) ABSTRACT

Provided is a method of fabricating a semiconductor package. The method include providing a lower package with an inner solder ball, providing a conductive material on the inner solder ball to form an outer solder ball enclosing the inner solder ball, providing an upper package with an upper solder ball, on the lower package, performing a first process at a first temperature to join the upper solder ball to the outer solder ball, and performing a second process at a second temperature to unite the upper, inner, and outer solder balls into a connection terminal.

20 Claims, 12 Drawing Sheets

(51) Int. Cl.
  *H01L 25/10* (2006.01)
  *H01L 23/31* (2006.01)
  *H01L 23/498* (2006.01)

(52) U.S. Cl.
  CPC ............. *H01L 2225/1058* (2013.01); *H01L 2225/1082* (2013.01); *H01L 2924/1431* (2013.01); *H01L 2924/1434* (2013.01); *H01L 2924/1436* (2013.01); *H01L 2924/1438* (2013.01); *H01L 2924/15311* (2013.01); *H01L 2924/15331* (2013.01); *H01L 2924/18161* (2013.01); *H01L 2924/3511* (2013.01)

(56) References Cited

U.S. PATENT DOCUMENTS

| | | |
|---|---|---|
| 8,604,614 B2 | 12/2013 | Kwon et al. |
| 8,658,466 B2 | 2/2014 | Hsieh et al. |
| 8,704,354 B2 | 4/2014 | Cheng et al. |
| 8,809,181 B2 | 8/2014 | Sidhu et al. |
| 9,111,926 B2 | 8/2015 | Byun et al. |
| 2003/0168739 A1 | 9/2003 | Huang |
| 2010/0096754 A1 | 4/2010 | Lee et al. |
| 2011/0233771 A1 | 9/2011 | Kwon et al. |
| 2012/0100669 A1 | 4/2012 | Jang et al. |
| 2013/0256914 A1 | 10/2013 | Cheng et al. |
| 2013/0334681 A1 | 12/2013 | Hsieh et al. |
| 2014/0065771 A1* | 3/2014 | Gruber ................ B23K 3/0638 438/121 |
| 2014/0124925 A1 | 5/2014 | Sidhu et al. |
| 2014/0209666 A1 | 7/2014 | Interrante et al. |
| 2014/0264940 A1 | 9/2014 | Byun et al. |
| 2014/0335657 A1* | 11/2014 | Kwon ............... H01L 23/49816 438/109 |

OTHER PUBLICATIONS

Eslampour, Hamid et al., "Advancements in Package-on-Package (PoP) Technology, Delivering Performance, Form Factor & Cost Benefits in Next Generation Smartphone Processors", 2013 Electronic Components & Technology Conference, 2013 IEEE, pp. 1823-1828.

Eslampour, Hamid et al., "Comparison of Advanced PoP Package Configurations", 2010 Electronic Components and Technology Conference, 2010 IEEE, pp. 1946-1950.

Maxim Integrated, "PCB Design Considerations and Guidelines for 0.4MM and 0.5MM WLPS", (https://www.maximintegrated.com/cn/app-notes/index.mvp/id/5283), retrieved Dec. 11, 2015, pp. 1-6.

Wikipedia, the free encyclopedia, "Solder", (https://en.wikipedia.org/wiki/Solder), retrieved Dec. 11, 2015, pp. 1-54.

* cited by examiner

METHODS OF FABRICATING A SEMICONDUCTOR PACKAGE

CROSS-REFERENCE TO RELATED APPLICATIONS

This U.S. non-provisional patent application claims priority under 35 U.S.C. §119 to Korean Patent Application No. 10-2015-0086003, filed on Jun. 17, 2015, in the Korean Intellectual Property Office, the entire contents of which are hereby incorporated by reference.

BACKGROUND OF THE INVENTION

Example embodiments of the inventive concept relate to a method of fabricating a semiconductor package, and in particular, to a method of fabricating a semiconductor package, in which an inner solder ball and an outer solder ball enclosing the inner solder ball are provided.

In the semiconductor industry, various package technologies have been developed to meet demands for large storage, thin thickness, and small size of semiconductor devices and/or electronic appliances. One approach is a package-on-package (PoP) technology through which semiconductor chips are vertically stacked to realize a high density chip stacking. The PoP technology can integrate many kinds of semiconductor chips in smaller areas compared to a general package with a single semiconductor chip.

Unfortunately, with the continuing effort to improve semiconductor performance, semiconductor chips continue to decrease in size. Thus, there is a continuing need for techniques that permit manufacturers to reliably increase chip density.

SUMMARY

Example embodiments of the inventive concept provide a method of fabricating a semiconductor package, in which upper and lower packages are flawlessly coupled to each other.

According to example embodiments of the inventive concept, a method of fabricating a semiconductor package may include providing a lower package with an inner solder ball, providing a conductive material on the inner solder ball to form an outer solder ball enclosing the inner solder ball, providing an upper package with an upper solder ball, on the lower package, performing a first process at a first temperature to join the upper solder ball to the outer solder ball, and performing a second process at a second temperature to unite the upper, inner, and outer solder balls into a connection terminal.

In some embodiments, the second temperature may be higher than the first temperature.

In some embodiments, the outer solder ball may be formed to have a melting point lower than those of the inner and upper solder balls.

In some embodiments, the outer solder ball may be formed of one of $Bi_{58}Sn_{42}$, $In_{97}Ag_3$, $In_{90}Ag_{10}$, $In_{75}Pb_{25}$, $In_{70}Pb_{30}$, $In_{60}Pb_{40}$, $In_{50}Sn_{50}$, $In_{52}Sn_{48}$, $Sn86.5Zn_{5.5}In_{4.5}Bi_{3.5}$, $Bi_{57}Sn_{42}Ag_1$, $Sn_{43}Pb_{43}Bi_{14}$, $Sn_{46}Pb_{46}Bi_8$, $Bi_{52}Pb_{32}Sn_{16}$ or $Bi_{46}Sn_{34}Pb_{20}$.

In some embodiments, the upper solder ball and the inner solder ball may be formed of an alloy containing at least one of tin, silver, copper, nickel, bismuth, indium, antimony, or cerium.

In some embodiments, the first temperature may be higher than a melting point of the outer solder ball and may be lower than melting points of the upper and inner solder balls.

In some embodiments, the second temperature may be higher than melting points of the upper and inner solder balls.

In some embodiments, the forming of the outer solder ball may include providing the conductive material on the inner solder ball, and performing a thermal treatment at a third temperature, which is higher than a melting point of the conductive material and is lower than a melting point of the inner solder ball, to coat the inner solder ball with the conductive material.

In some embodiments, the conductive material may be provided in a form of a fluid and may be supplied on the inner solder ball using a paste-spraying nozzle.

In some embodiments, the conductive material may be provided in a form of a solid and may be supplied on the inner solder ball using a solder ball carrier.

In some embodiments, the connection terminal may be formed of a mixture of materials constituting the upper, inner, and outer solder balls.

In some embodiments, the method may further include disposing a board below a resulting structure prepared by the second process, and joining the board to the resulting structure.

In some embodiments, the method may further include joining the lower package to a board provided below the lower package, before the first process.

According to example embodiments of the inventive concept, a method of fabricating a semiconductor package may include stacking an upper package with an upper solder ball on a lower package with a lower solder ball, and performing a reflow process to form a package-on-package type semiconductor package. The forming of the lower package may include providing a lower package substrate, on which a lower semiconductor chip is mounted, forming a lower mold layer to cover the lower semiconductor chip and have a connection hole exposing a portion of the lower package substrate, and providing the lower solder ball in the connection hole. The lower solder ball may include an inner solder ball and an outer solder ball enclosing the inner solder ball. The reflow process may include performing a first process to join the upper solder ball to the outer solder ball of the lower solder ball and thereby to align the upper package on the lower package and performing a second process to join the inner and outer solder balls of the lower solder ball to the upper solder ball and thereby to electrically connect the lower package to the upper package.

In some embodiments, the first process may be performed at a temperature that is higher than a melting point of the outer solder ball and is lower than both of melting points of the lower and upper solder balls.

In some embodiments, the second process may be performed at a temperature higher than melting points of the upper and inner solder balls.

In some embodiments, the outer solder ball may be formed of or include a metallic material, whose melting point is lower than that of the inner solder ball.

According to example embodiments of the inventive concept, a method of fabricating semiconductor package may include disposing a lower package with a lower solder ball on a board, joining the board to the lower package, providing an upper package with an upper solder ball on the lower package, and performing a one-pass reflow process to join the lower package to the upper package. The lower solder ball may be formed to have a double-layered structure. For example, the lower solder ball may include an inner solder ball and an outer solder ball enclosing the inner solder ball. The process of joining the lower package to the upper package may include a first joining step of joining the outer solder ball to the upper solder ball and a second joining step of uniting the outer, inner, and upper solder balls into a single solder ball. Here, the first joining step may be performed at a process temperature lower than that for the second joining step.

In some embodiments, the first joining step may be performed in such a way that the upper solder ball and the inner solder ball are physically connected to each other by the outer solder ball.

In some embodiments, the second joining step may be performed to join the outer, inner, and upper solder balls into a connection terminal.

In another embodiment, a method of fabricating a semiconductor package is provided. The method includes: selecting a lower package that includes at least one inner solder ball and a conductive material disposed on the inner solder ball to form an outer solder ball that encloses the inner solder ball; and joining at least one upper solder ball of an upper package with each of the solder balls on the lower package by performing a first process at a first temperature to join the upper solder ball to the outer solder ball; and performing a second process at a second temperature to unite respective ones of the upper, inner, and outer solder balls into a connection terminal.

The second temperature may be higher than the first temperature. The respective outer solder ball may be formed with a material having a melting point that is lower than a melting point for the associated inner solder ball and upper solder ball. The first temperature may be higher than a melting point of the outer solder ball and is lower than a melting point of the upper solder ball and inner solder ball. The method may further include joining the semiconductor package on a circuit board.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
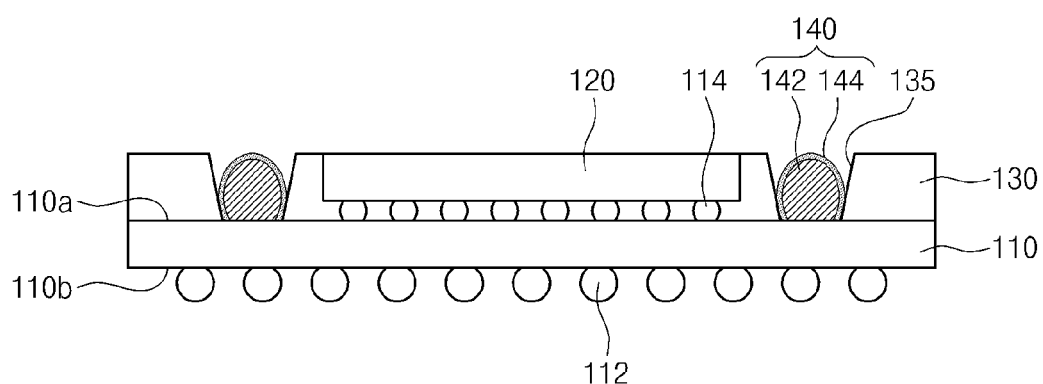
FIG. 1 is a sectional view illustrating a lower package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" "having" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a lower package according to example embodiments of the inventive concept.

Referring to FIG. 1, a lower package 100 may include a lower package substrate 110, a lower semiconductor chip 120, a lower mold layer 130, and a lower solder ball 140.

The lower package substrate 110 may have a top surface 110a and a bottom surface 110b facing each other. The lower package substrate 110 may be a printed circuit board (PCB) provided with circuit patterns. An outer terminal 112 (e.g., a solder ball) may be provided on the bottom surface 110b of the lower package substrate 110.

The lower semiconductor chip 120 may be mounted on the top surface 110a of the lower package substrate 110. A connection terminal 114 (e.g., a solder ball or a solder bump) may be provided between the lower semiconductor chip 120 and the lower package substrate 110 to electrically connect the lower semiconductor chip 120 to the lower package substrate 110. The lower semiconductor chip 120 may be, for example, a logic chip or a memory chip. The logic chip may be configured to include a logic element and a memory element. The memory chip may be at least one of, for example, DRAM, NAND FLASH, NOR FLASH, One NAND, PRAM, ReRAM, or MRAM devices.

The lower mold layer 130 may be provided on the lower package substrate 110 to enclose the lower semiconductor chip 120. The lower mold layer 130 may enclose the lower semiconductor chip 120 and expose a top surface of the lower semiconductor chip 120. The lower mold layer 130 may be formed to have at least one connection hole 135 exposing a portion of the lower package substrate 110. The connection hole 135 may be formed to penetrate the lower mold layer 130. The connection hole 135 may be provided spaced apart from the lower semiconductor chip 120, and in some embodiments, a plurality of connection holes 135 may be arranged to have symmetry about the lower semiconductor chip 120. The lower mold layer 130 may include an insulating polymer material (e.g., an epoxy molding compound (EMC)). In certain embodiments, the lower mold layer 130 may be provided to cover the top surface of the lower semiconductor chip 120.

The lower solder ball 140 may be provided in the connection hole 135 to be in contact with the lower package substrate 110. The lower solder ball 140 may include an inner solder ball 142 and an outer solder ball 144, which is provided to cover or enclose the inner solder ball 142. The inner solder ball 142 may be formed of a material having a melting point higher than that of the outer solder ball 144.

In some embodiments, the outer solder ball 144 may be formed of a material having a melting point of 180° C. or less. For example, the inner solder ball 142 may be formed of or include an alloy containing at least one of tin (Sn), silver (Ag), copper (Cu), nickel (Ni), bismuth (Bi), indium (In), antimony (Sb), or cerium (Ce), and the outer solder ball 144 may be formed of or include one of $Bi_{58}Sn_{42}$, $In_{97}Ag_3$, $In_{90}Ag_{10}$, $In_{75}Pb_{25}$, $In_{70}Pb_{30}$, $In_{60}Pb_{40}$, $In_{50}Sn_{50}$, $In_{52}Sn_{48}$, $Sn86.5Zn_{5.5}In_{4.5}Bi_{3.5}$, $Bi_{57}Sn_{42}Ag_1$, $Sn_{43}Pb_{43}Bi_{14}$, $Sn_{46}Pb_{46}Bi_8$, $Bi_{52}Pb_{32}Sn_{16}$, or $Bi_{46}Sn_{34}Pb_{20}$.

It should be noted that the term "inner solder ball" as used herein may be meant to include at least one inner solder ball or a plurality of inner solder balls. That is, referencing a single "inner solder ball" is not to be construed as limiting unless specifically identified as such. Similarly, referencing a single "outer solder ball" or "upper solder ball" is not to be construed as limiting unless specifically identified as such.

Further, it should be recognized the terms "inner," "upper," and "outer" with reference to a solder ball may actually refer to, for example, a single solder ball such as an inner solder ball, which has a coating or layer, such as an outer formation of a secondary material over the inner material. That is, as discussed herein, and inner solder ball and an outer solder ball may include a single ball of solder with an inner core and an outer layer. For a better understanding in this regard, also refer to the drawings provided herein.

Additionally, it should be recognized that the outer solder ball may not be a continuous ball. That is, the outer solder ball may be a portion of the sphere adequate to cover the inner solder balls, and thus essentially open at the base where the inner solder ball sits up on the lower package substrate 110.

FIGS. 2 through 10 are sectional views illustrating a method of fabricating a semiconductor package, according to example embodiments of the inventive concept.

Figure 8:
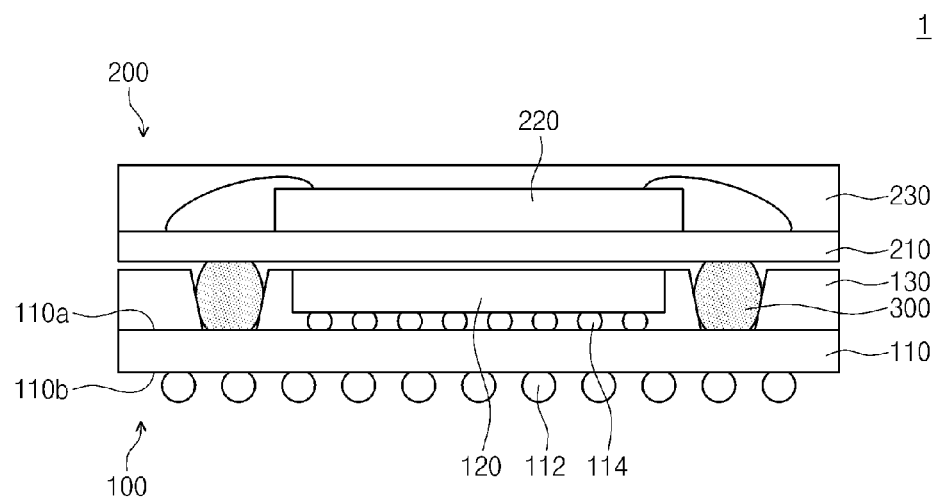
Figure 9:
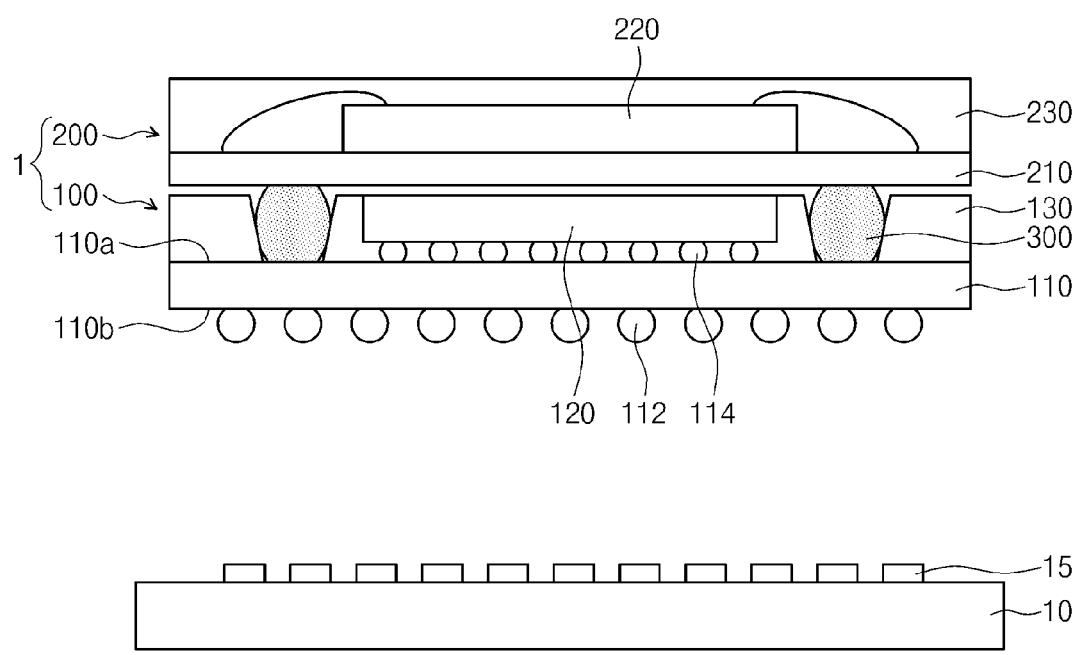
Figure 10:
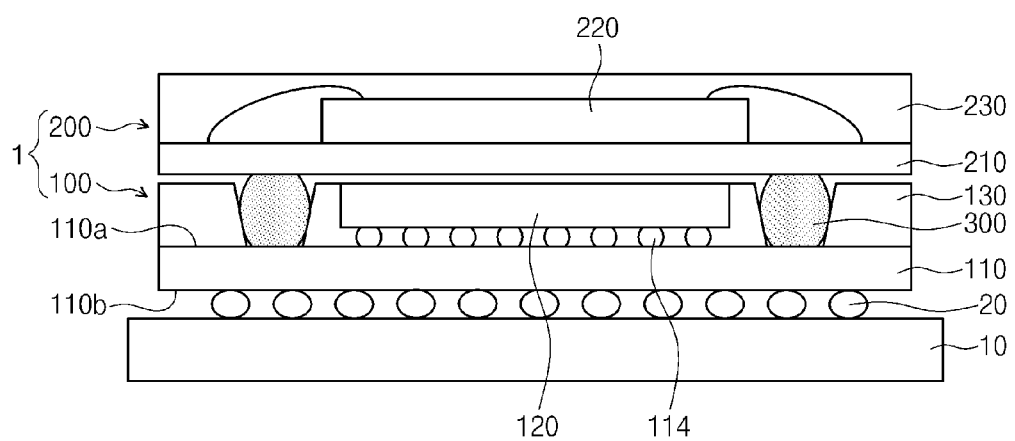

As an overview of this example, the method generally calls for selecting a lower package (FIG. 2); preparing a connection hole in the lower package (FIG. 3); providing a conductive material on an inner solder ball of the lower package (FIG. 4); disposing an outer solder ball over the inner solder ball (FIG. 5); disposing an upper package with an upper solder ball onto the lower package (FIG. 6); performing a first process to connect the upper solder ball of the upper package with the outer solder ball of the lower package (FIG. 7); performing a second process to join the lower solder balls and upper solder balls to provide a connection terminal (FIG. 8); and, optionally coupling the assembly to a board (FIG. 9, FIG. 10).

Figure 2:
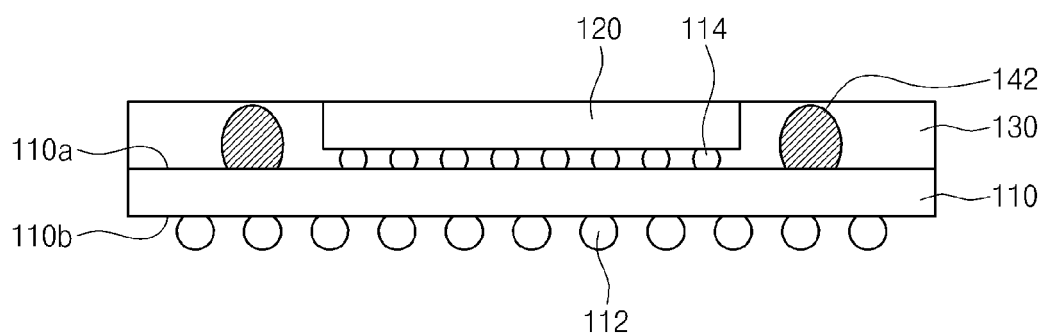
FIGS. 2 through 10 are sectional views illustrating a method of fabricating a semiconductor package, according to example embodiments of the inventive concept.

Referring to FIG. 2, the lower semiconductor chip 120 may be mounted on the top surface 110a of the lower package substrate 110, and the lower mold layer 130 may be formed to cover the top surface 110a of the lower package substrate 110 and the lower semiconductor chip 120. The inner solder ball 142 may be formed on the top surface 110a of the lower package substrate 110. In some embodiments, the plurality of the inner solder balls 142 may be formed around the lower semiconductor chip 120 and, for example, may be arranged in a symmetric manner. In some other embodiments, the plurality of inner solder balls 142 appear to be asymmetric. Each of the inner solder balls 142 may be formed of or include an alloy containing at least one of tin (Sn), silver (Ag), copper (Cu), nickel (Ni), bismuth (Bi), indium (In), antimony (Sb), or cerium (Ce). The plurality of inner solder balls 142 may be electrically connected to the lower package substrate 110. The lower mold layer 130 may be formed to expose the top surface of the lower semiconductor chip 120 and enclose the lower semiconductor chip 120.

Figure 3:
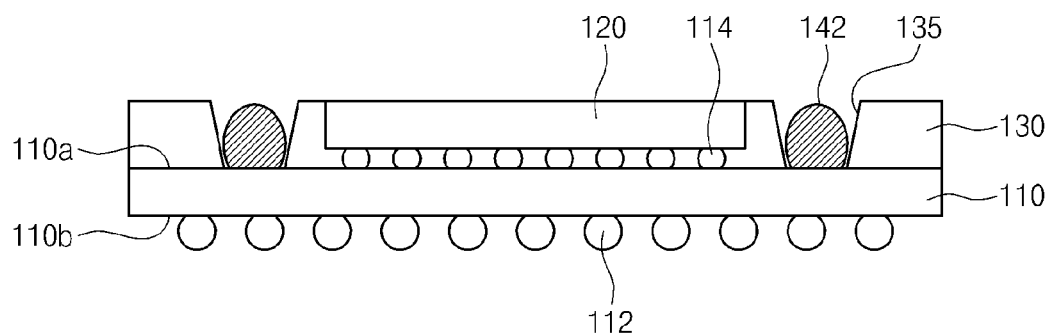

Referring to FIG. 3, the connection hole 135 may be formed to penetrate the lower mold layer 130. The connection hole 135 may be formed by, for example, a laser drilling process. The connection hole 135 may be provided to expose not only a portion of the top surface 110*a* of the lower package substrate 110 but also the inner solder ball 142 thereon.

Figure 4A:
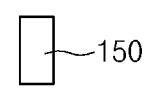
Figure 4A:
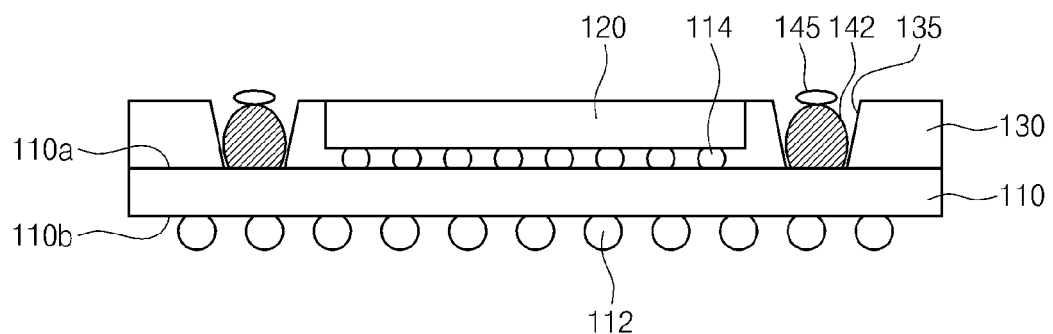
Figure 4B:
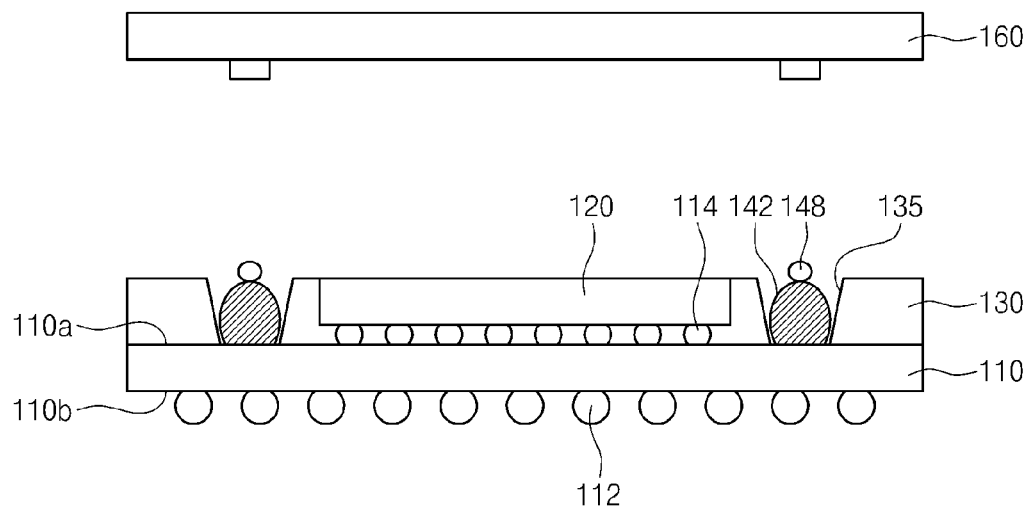

Referring to FIGS. 4A and 4B (collectively referred to herein as FIG. 4), a conductive material 145 and 148 may be provided on the inner solder ball 142. The conductive material 145 and 148 may be formed of or include one of $Bi_{58}Sn_{42}$, $In_{97}Ag_3$, $In_{90}Ag_{10}$, $In_{75}Pb_{25}$, $In_{70}Pb_{30}$, $In_{60}Pb_{40}$, $In_{50}Sn_{50}$, $In_{52}Sn_{48}$, $Sn_{86.5}Zn_{5.5}In_{4.5}Bi_{3.5}$, $Bi_{57}Sn_{42}Ag_1$, $Sn_{43}Pb_{43}Bi_{14}$, $Sn_{46}Pb_{46}Bi_8$, $Bi_{52}Pb_{32}Sn_{16}$, or $Bi_{46}Sn_{34}Pb_{20}$. As shown in FIG. 4A, the conductive material 145 may be provided on the inner solder balls 142 in a fluid state. A paste-spraying nozzle 150 may be used to provide or supply the conductive material 145 in the fluid state to the inner solder ball 142. Alternatively, as shown in FIG. 4B, the conductive material 148 may be provided on each of the inner solder balls 142 in a solid state. A solder ball carrier 160 may be used to provide or locate a ball-shaped quantity of conductive material 148 on or near at least one of the inner solder balls 142.

Figure 5:
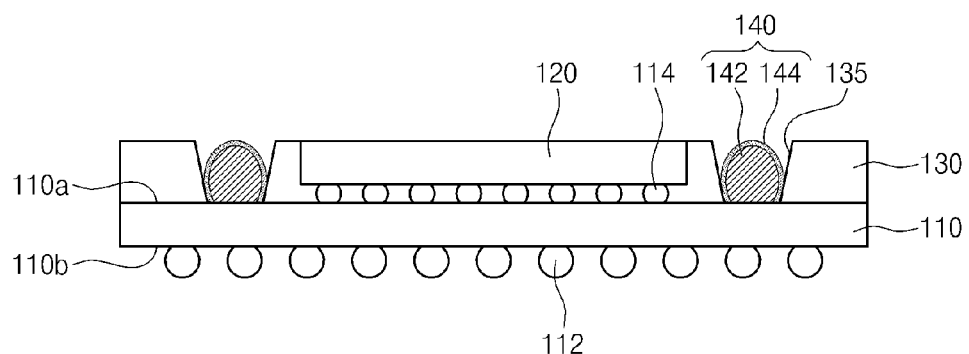

Referring to FIG. 5, the outer solder ball 144 may be formed to cover or enclose the inner solder ball 142. The outer solder ball 144 may be formed of a material having melting point lower than that of the inner solder ball 142, and, for example, the outer solder ball 144 may be formed of or include one of $Bi_{58}Sn_{42}$, $In_{97}Ag_3$, $In_{90}Ag_{10}$, $In_{75}Pb_{25}$, $In_{70}Pb_{30}$, $In_{60}Pb_{40}$, $In_{50}Sn_{50}$, $In_{52}Sn_{48}$, $Sn86.5Zn_{5.5}In_{4.5}Bi_{3.5}$, $Bi_{57}Sn_{42}Ag_1$, $Sn_{43}Pb_{43}Bi_{14}$, $Sn_{46}Pb_{46}Bi_8$, $Bi_{52}Pb_{32}Sn_{16}$, or $Bi_{46}Sn_{34}Pb_{20}$. A process temperature may be the first temperature; the conductive material 145 or 148 may be molten in the first temperature. The first temperature may be lower than a melting point of the inner solder ball 142 and may be higher than a melting point of the conductive material 145 or 148. For example, the first temperature may range from 138° C. to 180° C. As a result of the thermal treatment, the conductive material 145 or 148 may be molten to enclose the inner solder ball 142. Thereafter, the process temperature may be lowered below the first temperature, and thus, the conductive material 145 or 148 may be hardened to form the outer solder ball 144. The outer solder ball 144 enclosing the inner solder ball 142 may prevent the inner solder ball 142 from being oxidized at a high temperature process.

Figure 6:
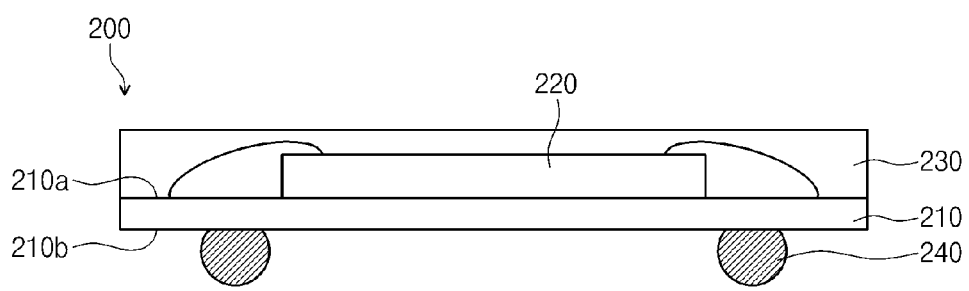
Figure 6:
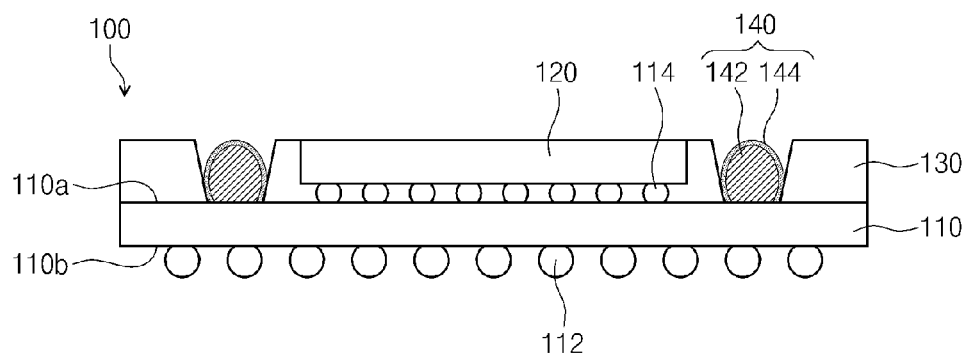

Referring to FIG. 6, an upper package 200 may be disposed on the lower package 100. The upper package 200 may include an upper package substrate 210, an upper semiconductor chip 220, and an upper mold layer 230. The upper package substrate 210 may have a top surface 210*a* and a bottom surface 210*b* facing each other, and the upper package substrate 210 may be a printed circuit board (PCB) provided with circuit patterns. An upper solder ball 240 may be provided on the bottom surface 210*b* of the upper package substrate 210. The upper solder ball 240 may be formed of a material having a melting point higher than that of the outer solder ball 144. For example, the upper solder ball 240 may be formed of or include an alloy including at least one of tin (Sn), silver (Ag), copper (Cu), nickel (Ni), bismuth (Bi), indium (In), antimony (Sb), or cerium (Ce). The upper semiconductor chip 220 may be provided on and electrically connected to the upper package substrate 210 by a wire bonding technology. In some embodiments, the upper semiconductor chip 220 may be a memory chip. The upper mold layer 230 may be formed to cover the top surface 210*a* of the upper package substrate 210 and to cover the upper semiconductor chip 220. The upper mold layer 230 may include an insulating polymer material (e.g., an epoxy molding compound (EMC)).

Figure 7:
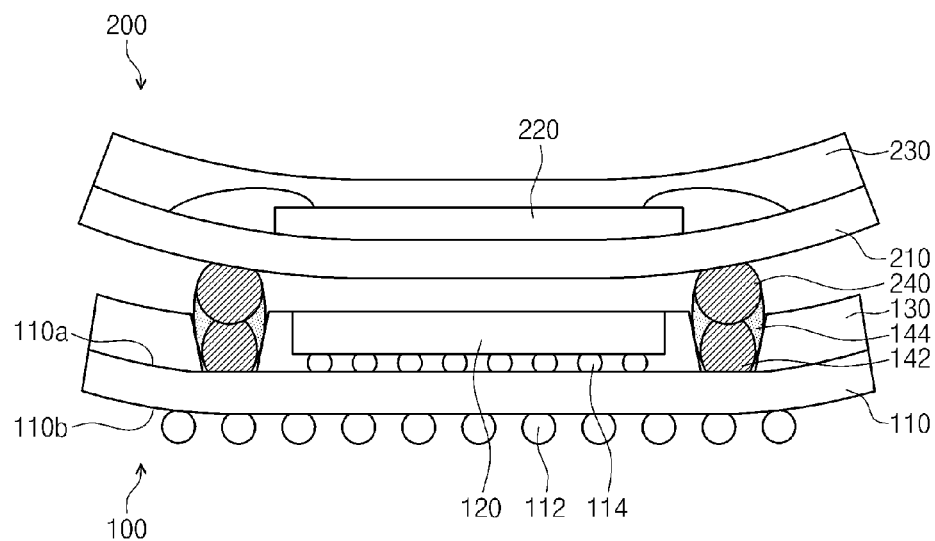

Referring to FIG. 7, a first process may be performed to connect the upper solder ball 240 with the outer solder ball 144. The first process may be performed at a second temperature. The second temperature may be lower that the melting point of the upper solder ball 240 and the inner solder ball 142 and higher than the melting point of the outer solder ball 144. For example, the second temperature may range from 138° C. to 180° C. If the process temperature reaches the second temperature, the outer solder ball 144 may become molten and be joined to the upper solder ball 240; for example, the outer solder ball 144 may be molten to have a structure enclosing the inner solder ball 142 and the upper solder ball 240. Accordingly, the upper package 200 and the lower package 100 may be connected to each other to form a first coupled structure.

The formation of the first coupled structure may include aligning the upper package 200 on the lower package 100. Although the lower and upper packages 100 and 200 may be deformed by a high temperature process, the lower and upper packages 100 and 200 may be fixedly connected to each other to provide for the first coupled structure according to example embodiments of the inventive concept, and thus, it is possible to prevent the lower and upper packages 100 and 200 from being thermally deformed.

Referring to FIG. 8, a second process may be performed to join the lower and upper solder balls 140 and 240 to each other and thereby to form a connection terminal 300, and in this case, the lower and upper packages 100 and 200 may be connected with each other through the connection terminal 300 to form a second coupled structure or a semiconductor package 1. The second process may be performed at a third temperature. The third temperature may be higher than the melting points of the lower and upper solder balls 140 and 240. For example, the third temperature may range from 180° C. to 240° C. Thereafter, a process temperature may be decreased below the third temperature, and in this case, the lower and upper solder balls 140 and 240 may be hardened to form the connection terminal 300. The connection terminal 300 may be formed of an alloy material, in which materials constituting the lower and upper solder balls 140 and 240 are mixed. By forming the first coupled structure, it is possible to prevent the lower and upper packages 100 and 200 from being misaligned with respect to each other, and by forming the second coupled structure, the connection terminal 300 may be formed to have a defect-free structure, and this may make it possible for the lower and upper packages 100 and 200 to be connected to each other without any defect. Since the lower solder ball 140 is provide to have a double-layered structure, it is possible to prevent the lower and upper packages 100 and 200 from being deformed or misaligned and thereby to form the connection terminal 300 having a defect-free structure.

Referring to FIG. 9, a board 10 may be disposed below the bottom surface 110*b* of the lower package substrate 110. The board 10 may be a board for a mobile device (e.g., cellular phone) or a memory module. A board terminal 15 may be provided on the board 10.

Referring to FIG. 10, the semiconductor package 1 may be stacked on the board 10. The board terminal 15 on the board 10 may be joined to the outer terminal 112 on the bottom surface 110b of the lower package substrate 110 to form a board connection terminal 20, and the board 10 and the semiconductor package 1 may be electrically connected to each other through the board connection terminal 20.

Figure 11:
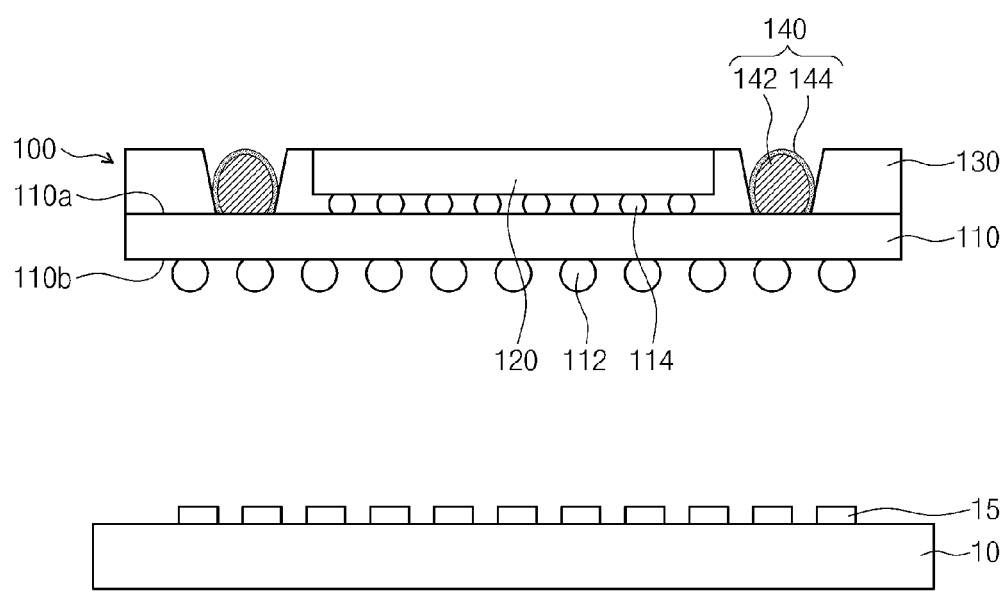
FIGS. 11 through 13 are sectional views illustrating a method of fabricating a semiconductor package, according to other example embodiments of the inventive concept.
Figure 12:
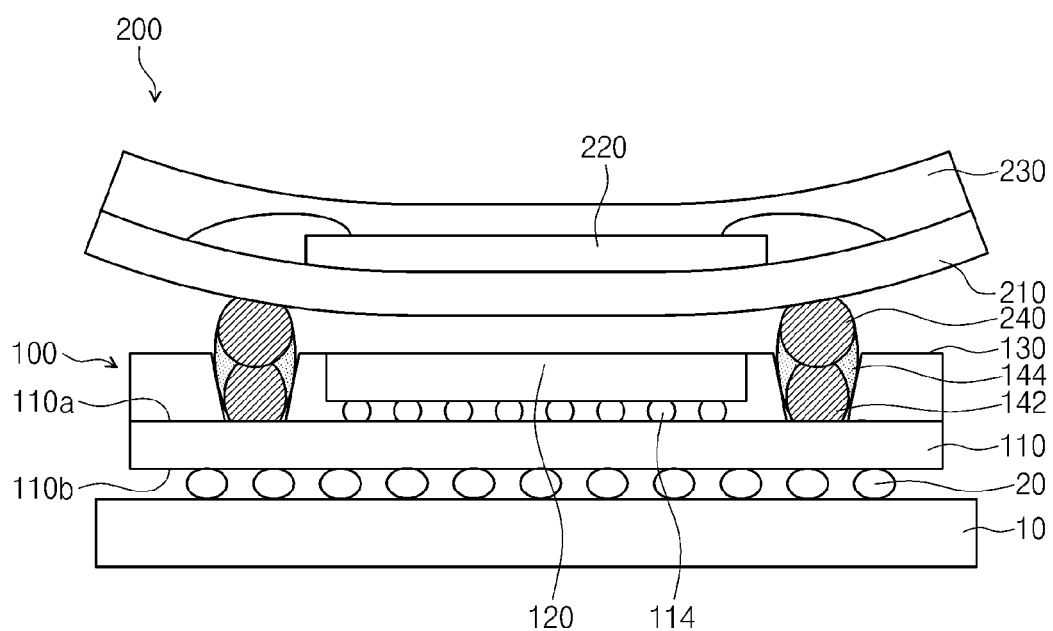
Figure 13:
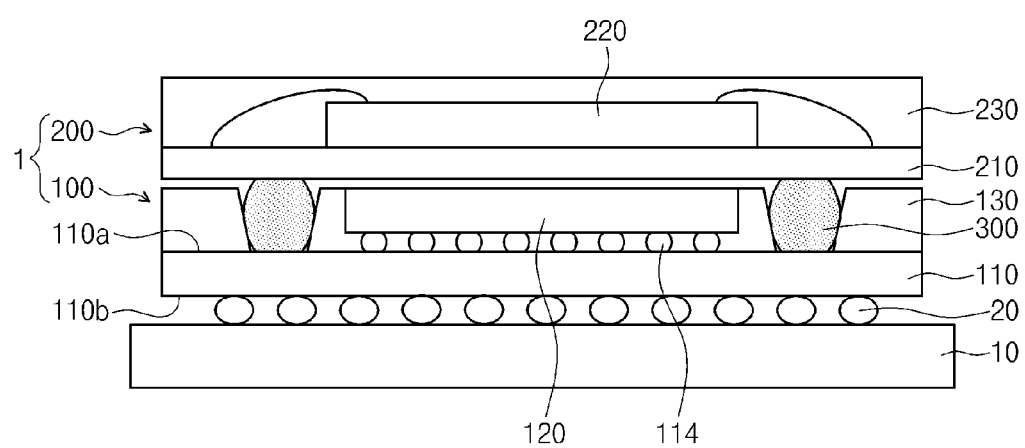

FIGS. 11 through 13 are sectional views illustrating a method of fabricating a semiconductor package, according to other example embodiments of the inventive concept. For concise description, a previously described element or step may be identified by a similar or identical reference number without repeating an overlapping description thereof.

Referring to FIG. 11, to perform a one-pass reflow process, the lower package 100 may be stacked on the board 10. The lower package 100 may include the lower package substrate 110, the lower semiconductor chip 120, the lower mold layer 130, and the lower solder ball 140, and the lower solder ball 140 may include the inner solder ball 142 and the outer solder ball 144, which is provided to cover or enclose the inner solder ball 142. The outer solder ball 144 may be formed of a material having a melting point lower than that of the inner solder ball 142. The board terminal 15 on the board 10 may be connected to the outer terminal 112 on the bottom surface 110b of the lower package substrate 110 to form the board connection terminal 20.

Referring to FIG. 12, the upper package 200 may be disposed on the lower package 100. The upper package 200 may include the upper package substrate 210, the upper semiconductor chip 220, and the upper mold layer 230, and the upper solder ball 240 may be provided on the bottom surface 210b of the upper package substrate 210. The upper solder ball 240 may be formed of a material having a melting point higher than that of the outer solder ball 144.

A first process may be performed to connect the upper solder ball 240 with the outer solder ball 144. The first process may be performed at a first temperature. The first temperature may be lower than melting points of the upper solder ball 240 and the inner solder ball 142 and higher a melting point of the outer solder ball 144. For example, the first temperature may range from 138° C. to 180° C. If the process temperature reaches the first temperature, the outer solder ball 144 may be molten and be joined to the upper solder ball 240; for example, the outer solder ball 144 may be molten to have a structure enclosing the inner solder ball 142 and the upper solder ball 240. Accordingly, the lower and upper packages 100 and 200 may be connected to each other to form a first coupled structure.

The formation of the first coupled structure may include aligning the upper package 200 on the lower package 100. Although the lower and upper packages 100 and 200 may be deformed by a high temperature process, the lower and upper packages 100 and 200 may be fixedly connected to each other by the first coupled structure according to example embodiments of the inventive concept, and thus, it is possible to prevent the lower and upper packages 100 and 200 from being thermally deformed.

Referring to FIG. 13, a second process may be performed to join the lower solder balls 140 and upper solder balls 240 to each other and thereby to form a connection terminal 300, and in this case, the lower package 100 and upper package 200 may be connected with each other through the connection terminal 300 to form a second coupled structure. The second process may be performed at a second temperature. The second temperature may be higher than the melting points of the lower solder balls 140 and upper solder balls 240. For example, the second temperature may range from 180° C. to 240° C. Thereafter, a process temperature may be decreased below the second temperature, and in this case, the lower solder balls 140 and upper solder balls 240 may be hardened to form the connection terminal 300. The connection terminal 300 may be formed of an alloy material, in which materials constituting the lower solder balls 140 and upper solder balls 240 are mixed. By forming the first coupled structure, it may be possible to prevent the lower package 100 and upper package 200 from being misaligned with respect to each other, and by forming the second coupled structure, the connection terminal 300 may be formed to have a defect-free structure, and this may make it possible for the lower package 100 and upper package 200 to be connected to each other without any defect. Since the lower solder ball 140 is provide to have a double-layered structure, it is possible to prevent the lower package 100 and upper package 200 from being deformed or misaligned and thereby to form the connection terminal 300 having a defect-free structure.

Figure 14:
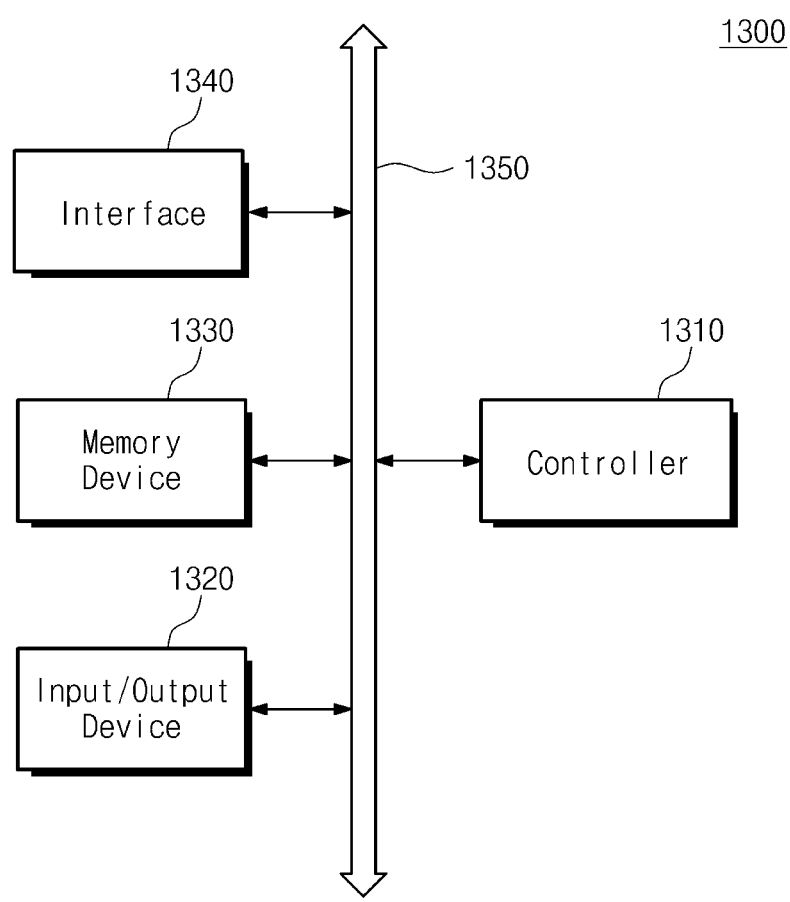
FIG. 14 is a block diagram illustrating an example of an electronic device including a semiconductor package according to example embodiments of the inventive concept.

FIG. 14 is a block diagram illustrating an example of an electronic device including a semiconductor package according to example embodiments of the inventive concept.

The semiconductor package according to example embodiments of the inventive concept may be applied to an electronic system. For example, the semiconductor package according to example embodiments of the inventive concept may be provided in the form of a memory device. Referring to FIG. 14, an electronic system 1300 may include a controller 1310, an input/output (I/O) unit 1320, and a memory device 1330. The controller 1310, the I/O unit 1320, and the memory device 1330 may be combined with each other through a data bus 1350. The data bus 1350 may correspond to a path through which electrical signals are transmitted. The controller 1310 may include at least one of a microprocessor, a digital signal processor, a microcontroller, or another similar logic device. The controller 1310 and the memory device 1330 may include one of the semiconductor packages according to example embodiments of the inventive concept. The I/O unit 1320 may include at least one of a keypad, a keyboard and/or a display unit. The memory device 1330 may store data and/or commands executed by the controller 1310. The memory device 1330 may include a volatile memory device and/or a nonvolatile memory device. For example, the memory device 1330 may include a FLASH memory device. The FLASH memory device may be realized as solid-state disks (SSD). In this case, the electronic system 1300 may stably store mass data to the FLASH memory system. The electronic system 1300 may further include an interface unit 1340, which transmits electrical data to a communication network or receives electrical data from a communication network. The interface unit 1340 may be configured to operate in a wireless or wired manner. For example, the interface unit 1340 may include an antenna for wireless communication or a transceiver for wired communication. Although not shown in the drawings, the electronic system 1300 may further include an application chipset, a camera image processor (CIS), and an input-output unit.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 15:
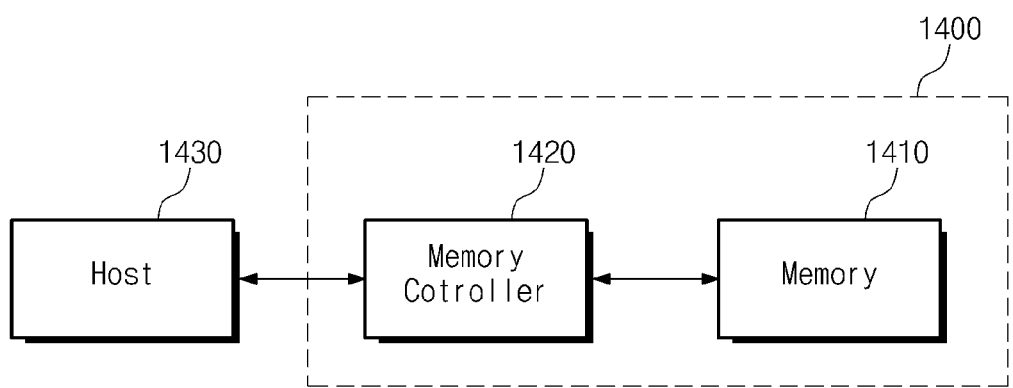
FIG. 15 is a block diagram illustrating an example of a memory system including a semiconductor package according to example embodiments of the inventive concept.

FIG. 15 is a block diagram illustrating an example of a memory system including a semiconductor package according to example embodiments of the inventive concept.

The semiconductor package may be provided in the form of a memory card. Referring to FIG. 15, a memory system 1400 may include a non-volatile memory device 1410 (e.g., a FLASH memory device) and a memory controller 1420. The non-volatile memory device 1410 and the memory controller 1420 may be configured to store data or read stored data. The non-volatile memory device 1410 may include at least one of the semiconductor packages according to example embodiments of the inventive concept. The memory controller 1420 may control the non-volatile memory device 1410 to read the stored data and/or to store data in response to read/write request of a host 1430.

According to example embodiments of the inventive concept, first and second processes may be performed to join an upper package to a lower package without misalignment therebetween.

According to other example embodiments of the inventive concept, a lower solder ball may be formed to have an inner solder ball and an outer solder ball. Due to the presence of the outer solder ball, it is possible to prevent the inner solder ball from being oxidized during a high temperature process.

According to still other example embodiments of the inventive concept, by performing the first process, it is possible to fasten the upper package on the lower package and thereby to prevent the upper and lower packages from being deformed. The second process may allow for the upper and lower packages to be joined to each other without defect.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor package, comprising:
   providing a lower package with an inner solder ball;
   providing a conductive material on the inner solder ball to form an outer solder ball enclosing the inner solder ball;
   providing an upper package with an upper solder ball, on the lower package;
   performing a first process at a first temperature to join the upper solder ball to the outer solder ball; and
   performing a second process at a second temperature to unite the upper, inner, and outer solder balls into a connection terminal.

2. The method of claim 1, wherein the second temperature is higher than the first temperature.

3. The method of claim 1, wherein the outer solder ball is formed to have a melting point lower than those of the inner and upper solder balls.

4. The method of claim 1, wherein the outer solder ball is formed of one of Bi58Sn42, In97Ag3, In90Ag10, In75Pb25, In70Pb30, In60Pb40, In50Sn50, In52Sn48, Sn86.5Zn5.5In4.5Bi3.5, Bi57Sn42Ag1, Sn43Pb43Bi14, Sn46Pb46Bi8, Bi52Pb32Sn16, or Bi46Sn34Pb20.

5. The method of claim 1, wherein the upper solder ball and the inner solder ball is formed of an alloy containing at least one of tin, silver, copper, nickel, bismuth, indium, antimony, or cerium.

6. The method of claim 1, wherein the first temperature is higher than a melting point of the outer solder ball and is lower than melting points of the upper and inner solder balls.

7. The method of claim 1, wherein the second temperature is higher than melting points of the upper and inner solder balls.

8. The method of claim 1, wherein the forming of the outer solder ball comprises:
   providing the conductive material on the inner solder ball; and
   performing a thermal treatment at a third temperature, which is higher than a melting point of the conductive material and is lower than a melting point of the inner solder ball, to coat the inner solder ball with the conductive material.

9. The method of claim 8, wherein the conductive material is provided in a form of a fluid and is supplied on the inner solder ball using a paste-spraying nozzle.

10. The method of claim 8, wherein the conductive material is provided in a form of a solid and is supplied on the inner solder ball using a solder ball carrier.

11. The method of claim 1, wherein the connection terminal is formed of a mixture of materials constituting the upper, inner, and outer solder balls.

12. The method of claim 1, further comprising:
   disposing a board below a resulting structure prepared by the second process; and
   joining the board to the resulting structure.

13. A method of fabricating a semiconductor package, comprising:
   stacking an upper package with an upper solder ball on a lower package with a lower solder ball; and
   performing a reflow process to form a package-on-package type semiconductor package,
   wherein the forming of the lower package comprises:
   providing a lower package substrate, on which a lower semiconductor chip is mounted;
   forming a lower mold layer to cover the lower semiconductor chip and have a connection hole exposing a portion of the lower package substrate; and
   providing the lower solder ball in the connection hole, the lower solder ball comprising an inner solder ball and an outer solder ball enclosing the inner solder ball,
   wherein the reflow process comprises:
   performing a first process to join the upper solder ball to the outer solder ball of the lower solder ball, thereby aligning the upper package on the lower package; and
   performing a second process to join the inner and outer solder balls of the lower solder ball to the upper solder ball, thereby electrically connecting the lower package to the upper package.

14. The method of claim 13, wherein the first process is performed at a temperature that is higher than a melting point of the outer solder ball and is lower than both of melting points of the lower and upper solder balls.

15. The method of claim 13, wherein the second process is performed at a temperature higher than melting points of the upper and inner solder balls.

16. A method of fabricating a semiconductor package, the method comprising:
   selecting a lower package comprising at least one inner solder ball and a conductive material disposed on the inner solder ball to form an outer solder ball that encloses the inner solder ball;

joining at least one upper solder ball of an upper package with each of the solder balls on the lower package by performing a first process at a first temperature to join the upper solder ball to the outer solder ball; and performing a second process at a second temperature to unite respective ones of the upper, inner, and outer solder balls into a connection terminal.

17. The method of claim 16, wherein the second temperature is higher than the first temperature.

18. The method of claim 16, wherein the respective outer solder ball is formed with a material having a melting point that is lower than a melting point for the associated inner solder ball and upper solder ball.

19. The method of claim 16, wherein the first temperature is higher than a melting point of the outer solder ball and is lower than a melting point of the upper solder ball and inner solder ball.

20. The method of claim 16, further comprising joining the semiconductor package on a circuit board.

* * * * *